(12) United States Patent
Starkston et al.

(10) Patent No.: US 7,772,090 B2
(45) Date of Patent: Aug. 10, 2010

(54) METHODS FOR LASER SCRIBING WAFERS

(75) Inventors: Robert Starkston, Phoenix, AZ (US);
Andrew Proctor, Chandler, AZ (US);
Steve Terry, Glendale, AZ (US)

(73) Assignee: Intel Corporation, Santa Clara, CA (US)

( * ) Notice: Subject to any disclaimer, the term of this patent is extended or adjusted under 35 U.S.C. 154(b) by 1270 days.

(21) Appl. No.: 10/674,960

(22) Filed: Sep. 30, 2003

(65) Prior Publication Data

US 2005/0067391 A1  Mar. 31, 2005

(51) Int. Cl.
*H01L 21/301* (2006.01)

(52) U.S. Cl. ..................... 438/462; 438/463

(58) Field of Classification Search .................
219/121.67–121.69, 121.72; 438/462, 463
See application file for complete search history.

(56) References Cited

U.S. PATENT DOCUMENTS

| | | | | |
|---|---|---|---|---|
| 6,420,245 | B1 * | 7/2002 | Manor | 438/460 |
| 6,586,707 | B2 * | 7/2003 | Boyle et al. | 219/121.69 |
| 6,737,606 | B2 * | 5/2004 | Peng et al. | 219/121.68 |
| 2003/0029212 | A1 * | 2/2003 | Im | 72/54 |
| 2004/0211750 | A1 * | 10/2004 | Palla | 216/4 |

FOREIGN PATENT DOCUMENTS

| | | | | |
|---|---|---|---|---|
| JP | 353002074 | A | * | 1/1978 |
| JP | 354029559 | A | * | 3/1979 |
| JP | 354109376 | A | * | 8/1979 |
| JP | 355046579 | A | * | 4/1980 |
| JP | 355050630 | A | * | 4/1980 |
| JP | 356061141 | A | * | 5/1981 |
| JP | 356096835 | A | * | 8/1981 |
| JP | 357172749 | A | * | 10/1982 |
| JP | 358143553 | A | * | 8/1983 |
| JP | 362262442 | A | * | 11/1987 |
| JP | 411163403 | A | * | 6/1999 |
| JP | 411284278 | A | * | 10/1999 |
| JP | 02001284292 | A | * | 10/2001 |
| JP | 02002261370 | A | * | 9/2002 |

OTHER PUBLICATIONS

Translation of JP411284278A, Oct. 1999, Japan, 37 pages.*
Translation of JP355046579A, Apr. 1980, Japan, Toshiba Corp, 5 pages.*
Translation of JP353002074A, Jan. 1978, Japan, 6 pages.*

* cited by examiner

*Primary Examiner*—Samuel M Heinrich
(74) *Attorney, Agent, or Firm*—Schwegman, Lundberg & Woessner, P.A.

(57) ABSTRACT

A method for singulating dies from a wafer includes laser scribing a continuous line on each side of the die, and laser ablating an area adjacent the laser scribed continuous line on each side of the die. The laser ablations in the area adjacent the laser scribed continuous line on each side of the die being spaced from one another. The method also includes sawing the laser abated area adjacent the continuous line. A method for singulating dies from a wafer includes laser scribing a first continuous line, laser scribing a second continuous line spaced apart from the first continuous line, and laser scribing a third continuous line. The third continuous line positioned between the first continuous line and the second continuous line. The third continuous line overlaps the second continuous line and the third continuous line.

5 Claims, 7 Drawing Sheets

METHODS FOR LASER SCRIBING WAFERS

FIELD OF THE INVENTION

The present invention is related to a wafer fabrication process. More specifically, the present invention relates to methods for laser scribing wafers before singulating wafers to produce individual die or chips.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A direct by-product of higher density circuits with smaller feature sizes is smaller die and, therefore, a higher number of die formed on a wafer. Typically, a number of identical electronic devices are formed on a single wafer. In some instances, up to several thousand identical devices are formed on a wafer. More commonly, 200 to 300 identical devices are formed on a wafer. Once formed, each of the devices is electrically tested and sorted. Next, the wafer is sliced and diced to produce individual wafer portions known as die or chips. Each die or chip contains an individual device, such as an integrated circuit, a microprocessor, or other electronic device. Each die also includes leads, such as pins or balls, which are formed on the surface of the die.

In some instances, the cut lines for slicing and dicing a wafer into individual chips or die are scribed using a laser. Laser scribing is most often used on newer silicon devices incorporating fragile high performance dielectric materials. Laser scribing precedes singulation (slicing and dicing the wafer into individual chips or die) with a diamond saw. The laser scribe step removes some of the fragile materials without leaving mechanical defects in the device edge which can propagate into the active device under normal mechanical loads and cause failures. The laser scribe step also prevents long, thin, fragments of the fragile dielectric and embedded Cu metal traces from peeling up and becoming entangled in the interconnect bumps.

Currently, multiple parallel scribe lines are needed to remove material which is wider than the kerf of the diamond saw blade. Currently, the multiple parallel scribe lines are placed next to one another. For example, a first scribe line is made and then a second scribe line is made adjacent to the first scribe line. A third scribe line is made adjacent to the second scribe line. Laser scribing also produces a plume of suspended material that results from the laser ablation of the surface when the laser pulses the surface of the wafer. When the laser scribe lines are always placed one next to the other to scribe the wafer, the plume associated with the laser scribing process seems to be directed to one side of the scribe line. Portions of the plume can settle or deposit on the solder associated with the leads to the circuitry within the die or chip. In some instances, the plume may even result in opens being found as a result of plume deposits on the leads preventing electrical connection to the leads. The silicon debris from the laser scribe plume that interferes with electrical interconnection between the die and a package results in yield losses and also potentially increases the reliability failure rate.

In addition, laser scribing also takes time. Currently, continuous laser scribe lines are formed. Lasers pulse so a continuous line is actually formed by overlapping individual pulses from the laser used to scribe the wafer. The amount of overlap between pulses may be as much as 90%. Each subsequent laser pulse typically overlaps the previous pulse by 20-90%.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set-out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
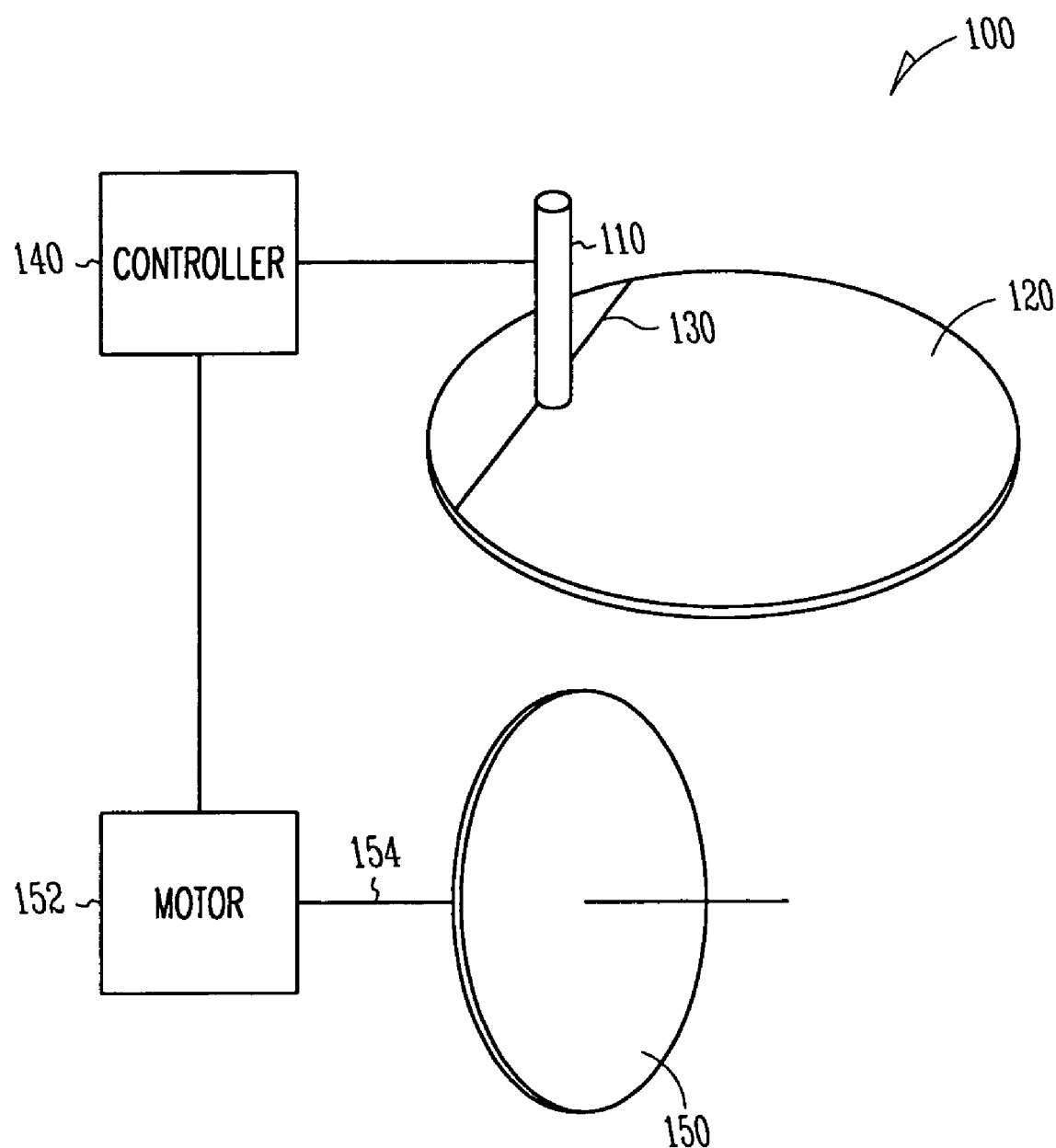
FIG. 1 is a schematic view of a laser scribing and cutting mechanism, according to an embodiment of the invention.

FIG. 1 is a schematic view of a laser scribing and cutting mechanism 100, according to an embodiment of this invention. The laser scribing and cutting mechanism 100 includes a laser 110. The laser 110 is positioned so that it can produce individual pulses of laser energy that is directed at a wafer 120. The laser 110 is also movable so that multiple laser pulses can be placed in a continuous line along the surface of the wafer 120. On the surface of wafer 120 there is a line 130 which is merely representative of a scribe line. The laser 110 is connected to a controller 140. The controller 140 controls movement of the laser 110 with respect to the surface of the wafer 120. The controller 140, in one embodiment, can move the laser 110 over the surface of the wafer 120. In an alternative embodiment, the wafer 120 may be moved with respect to the laser 110. The controller 140 is capable of controlling movements of the laser 110 with respect to the wafer 120 in either embodiment. The laser scribing and cutting mechanism 100 also includes a saw or grinding wheel 150. The saw or grinding wheel 150 is typically provided with a diamond surface so that it can cut the material of the wafer 120. Wafer 120 is made of a fragile dielectric material or similar hard material and, therefore, the saw or grinding wheel 150 must include a hard substance such as diamond. The saw or grinding wheel 150 is turned by motor 152 attached to a shaft 154. The shaft 154 is attached to the saw or grinding wheel 150. The motor 152 is also attached to the controller 140. Therefore, the controller 140 can control the speed of rotation of the grinding wheel as well as control the position of the grinding wheel or saw 150 with respect to the wafer 120.

Figure 2:
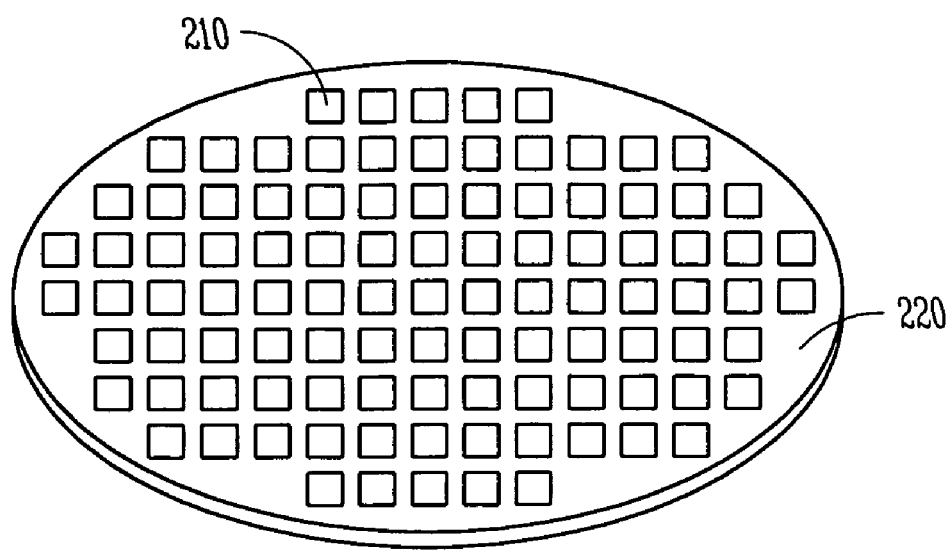
FIG. 2 is a perspective view of a wafer including a plurality of devices thereon, according to an embodiment of this invention.

FIG. 2 is a perspective view of a wafer 220 that includes a plurality of devices 210 thereon, according to an embodiment of this invention. The devices 210 are shown as squares or rectangles on the surface of the wafer 220. In actuality, the devices are embedded into the surface of the wafer 220. Generally, the wafer 220 will include as many as several thousand identical or nearly identical devices 210. More commonly 200-300 individual devices 210 are formed in the surface of the wafer 220. The identical devices are formed on the wafer through various processing steps. The individual devices 210 are then tested and sorted while still on the wafer 220. Once the individual devices 210 are tested and sorted, the wafer 220 is sliced and diced or cuts are made in two directions to singulate each of the devices from the wafer 220. In other words, singulation cuts the disk into pieces where each piece includes an individual device, such as an integrated circuit or a microprocessor, or the like.

Figure 3:
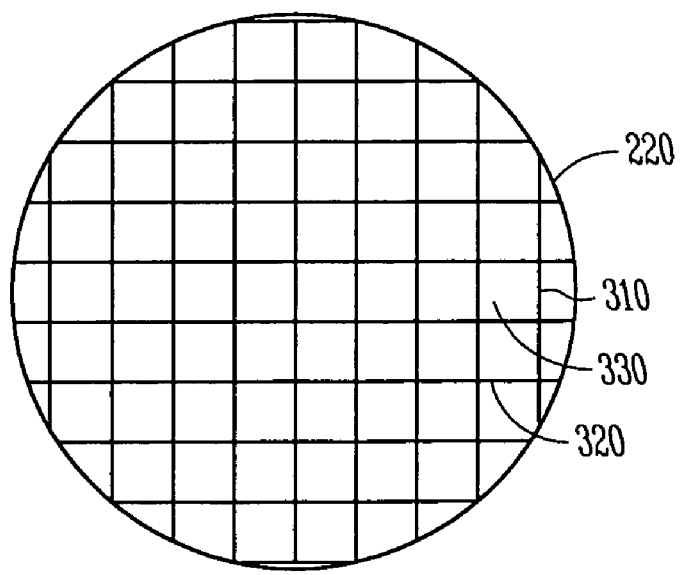
FIG. 3 is a top view of a wafer including laser scribe areas about the periphery of a plurality of devices on the wafer, according to an embodiment of this invention.

FIG. 3 is a top view of a wafer 220 that includes laser scribe areas about the periphery of the devices on the wafer 220, according to an embodiment of this invention. The laser scribe areas are depicted as straight black lines in FIG. 3. The vertical straight black lines carry reference numeral 310 while the horizontal black lines represent laser scribe areas which are horizontally oriented when viewed from the top of the wafer 220. The vertical laser scribe areas 310 and the horizontal scribe areas 320 bound areas 330 that are populated with an individual device. The individual devices 210 are not shown in FIG. 3, but would occupy an area bound by the laser scribe areas 310 and 320. When a wafer uses a fragile high performance dielectric material, laser scribing often precedes singulation. Laser scribing removes some of the fragile materials at or near the top surface of the wafer without leaving mechanical defects along the device edge. Without laser scribing, mechanical defects could propagate into the active device under normal mechanical loads and cause failures of the active device 210 (shown in FIG. 2). The mechanical defects spoken of above, may not propagate into the active device area until after the chip or die is packaged and leaves the factory. The laser scribing step also prevents long, thin, fragile dielectric and embedded CU metal traces from peeling up and becoming entangled in the leads that are attached to the device. In many instances, the leads are interconnect bumps arranged in an array and are also called a ball grid array. Other types of leads can also be used in the devices 210 (shown in FIG. 2).

Figure 4:
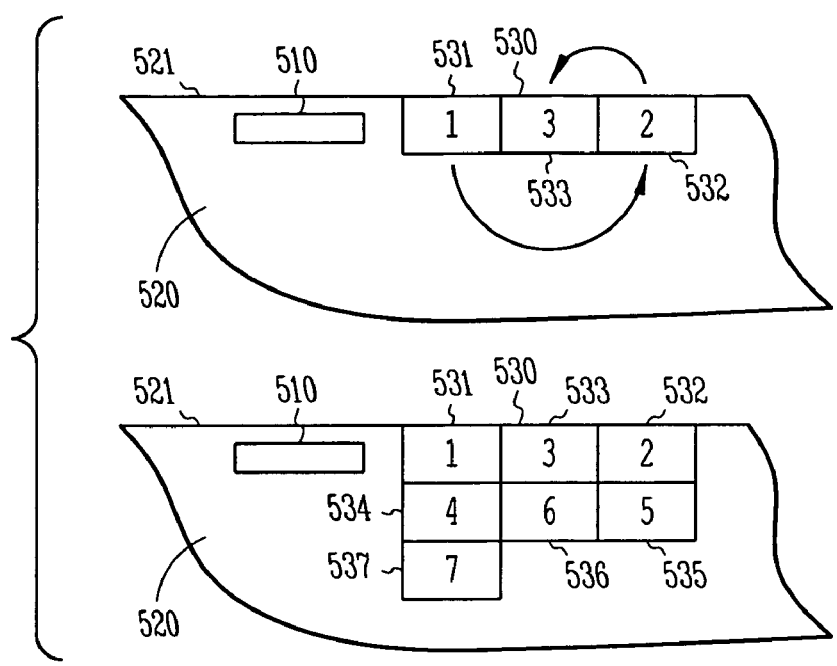
FIG. 4 is a diagram showing the steps in forming a laser scribe area, according to an embodiment of this invention.

Now with respect to FIGS. 4 and 5, a scribe line formed according to an embodiment of this invention will now be discussed. FIG. 4 is a diagram showing the steps in forming a laser scribe area 530. As shown in FIG. 4, the boxes represent end points of the laser scribe lines and also represent a portion of laser ablated material that is being removed by the laser scribe line. Initially, a laser scribe line 531 is made closest to an active device 510 near the a top surface 521 of a wafer 520. The laser scribe line 531 is substantially straight. The next step is to move the laser to a position and produce a laser scribe line 532, which is parallel to but in an overlapping relation with the laser scribe line 531. The next step is to write or produce a laser scribe line 533, which is between the laser scribe line 531 and the laser scribe line 532. The laser scribe line 533 is also an overlapping relation with respect to the first laser scribe line 531 and the second laser scribe line 532. The above sequence of forming scribe lines describes a single pass parallel scribe according to an embodiment of this invention.

Figure 5:
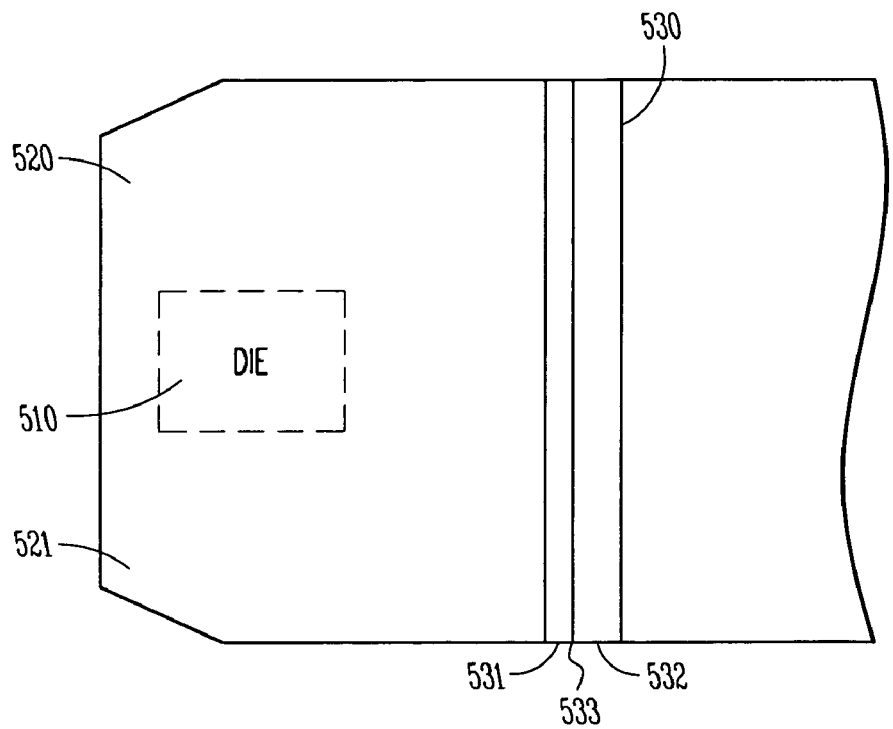
FIG. 5 is a top view of a wafer having a laser scribe area formed according to an embodiment of this invention.

Now turning briefly to FIG. 5, which is a top view of a wafer 520 having a laser scribe area formed as shown in FIG. 4, it can be seen that the laser scribe area includes a first laser scribe 531, represented by a dark line and a second laser scribe line 532 represented by a darker gray line, and a third laser scribe line 533, which is formed between the laser scribe line 531 and the laser scribe line 532. The laser scribe line 533 is a lighter gray than either of the laser scribe lines 531 or 532. It should be noted that the shades of gray shown in FIG. 5 are merely for the sake of illustrating the sequence of laser scribe lines that form the laser scribe area 530.

Now returning back to FIG. 4, a multiple pass scribe area is formed by forming scribe line 534 in the same position as scribe line 531. The result is that the scribe line 534 is formed in the trench of the scribe line of the ablated material removed by the scribe line 531. Scribe line 535 is formed in the same position as the scribe line 532 and, therefore, removes more wafer material 520 along the length of the scribe line in the same position as scribe line 532. Next, scribe line 536 is made or formed at the substantially similar position as scribe line 533. Scribe line 536 is between the scribe line 534 and the scribe line 535, and in overlapping relations to both scribe line 534 and scribe line 535. Finally, scribe line 537 is formed below the scribe lines 531 and 534. Similarly, the scribe line 537 is formed in the ditch or in the trench formed by ablating material as a result of scribe lines 531, and 534. Generally, in a multi-pass scribe area, the lowest or deepest trench formed by scribe lines 531, 534, and 537 will be near the active device 510 within the wafer 520. The deeper trench helps to prevent mechanical defects from propagating into the active device 510.

Figure 6:
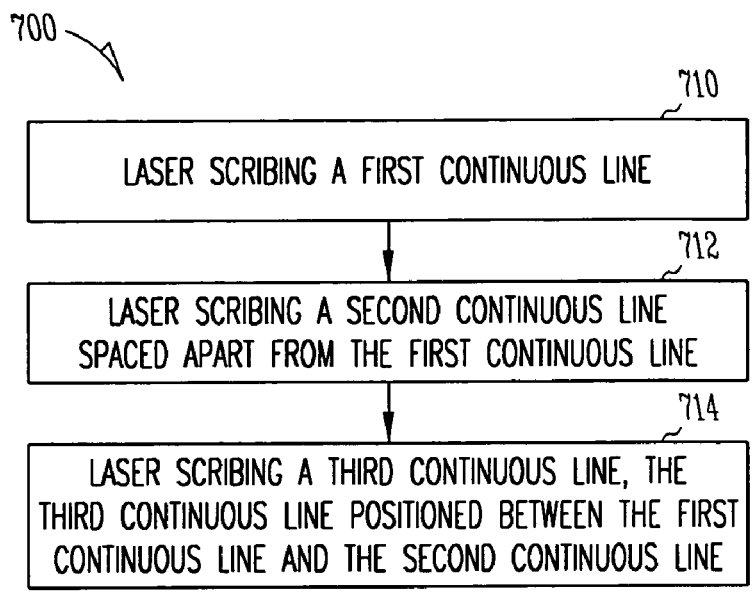
FIG. 6 is a flow diagram showing a method for forming a laser scribe area, according to the embodiment of this invention.

It should be noted that the scribe lines discussed with respect to FIGS. 4 and 5 are continuous scribe lines. Continuous scribe lines are made by a laser, such as laser 110 shown in FIG. 1. Lasers are pulsed. Therefore, continuous scribe lines, such as those discussed in FIGS. 5 and 6 are actually made by pulsing a laser many times. The laser 110 is moved with respect to the wafer 520 a slight distance when making a single scribe line. There is an amount of overlap between one pulse and the next pulse of approximately 20% to 90% when making a continuous scribe line. It should be noted that scribe lines or scribe areas are formed to surround the active device 510 before singulating the wafer into chips or dies. Each chip or die generally includes an active device 510. In some instances, a device may have failed.

FIG. 6 is a flow diagram showing a method for forming a laser scribe area 700, according to the embodiment of this invention. The method for laser scribing a wafer 700 includes laser scribing a first continuous line 710, and laser scribing a second continuous line spaced apart from the first continuous line 712. A third continuous line is then laser scribed at a position between the first continuous line and the second continuous line 714. In some embodiments, the first continuous line, the second continuous line and the third continuous line overlap. In other words, the third continuous line overlaps the second continuous line and the third continuous line. The first continuous line, the second continuous line and the third continuous line are formed from overlapping pulses from a laser 110 (shown in FIG. 1). The first continuous line, the second continuous line and the third continuous line overlap in an area having a width greater than the width of a saw blade or greater than the width of a kerf from a saw blade.

Figure 7:
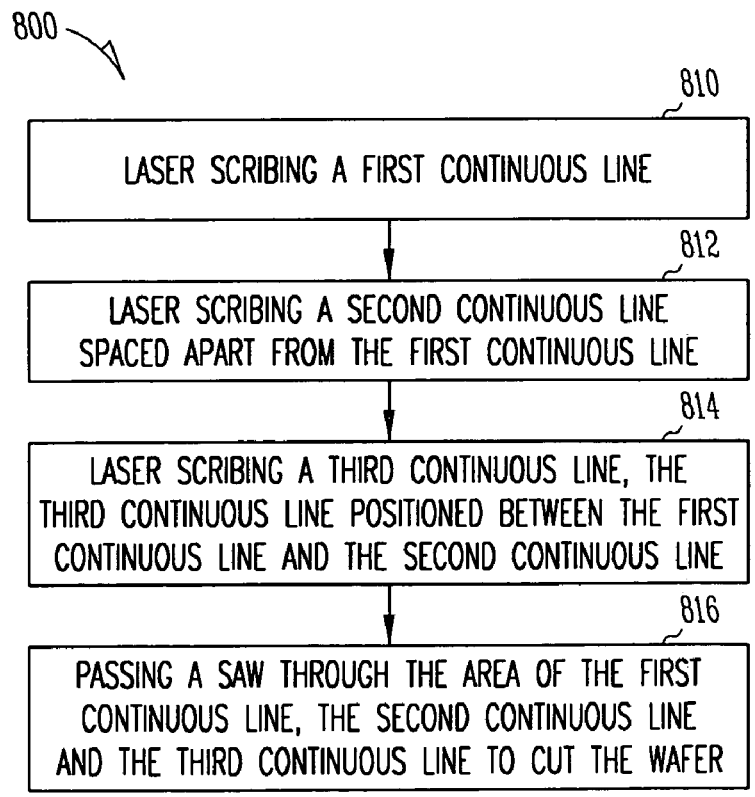
FIG. 7 is a flow diagram showing a method for singulating dies from a wafer, according to the embodiment of this invention.

FIG. 7 is a flow diagram showing a method for singulating dies from a wafer 800, according to the embodiment of this invention. The method for singulating dies from a wafer 800 includes laser scribing a first continuous line 810, laser scribing a second continuous line spaced apart from the first continuous line 812, and laser scribing a third continuous line 814. The third continuous line positioned between the first continuous line and the second continuous line, as depicted by reference number 814. The method 800 also includes passing a saw through the area of the first continuous line, the second continuous line and the third continuous line to cut the wafer 816. The first continuous line, the second continuous line and the third continuous line overlap. In some embodiments, the third continuous line overlaps the second continuous line and the third continuous line. The first continuous line, the second continuous line and the third continuous line are formed from overlapping pulses from a laser 110 (shown in FIG. 1). The first continuous line, the second continuous line and the third continuous line overlap in an area having a width greater than the width of a kerf from a saw blade.

Figure 8:
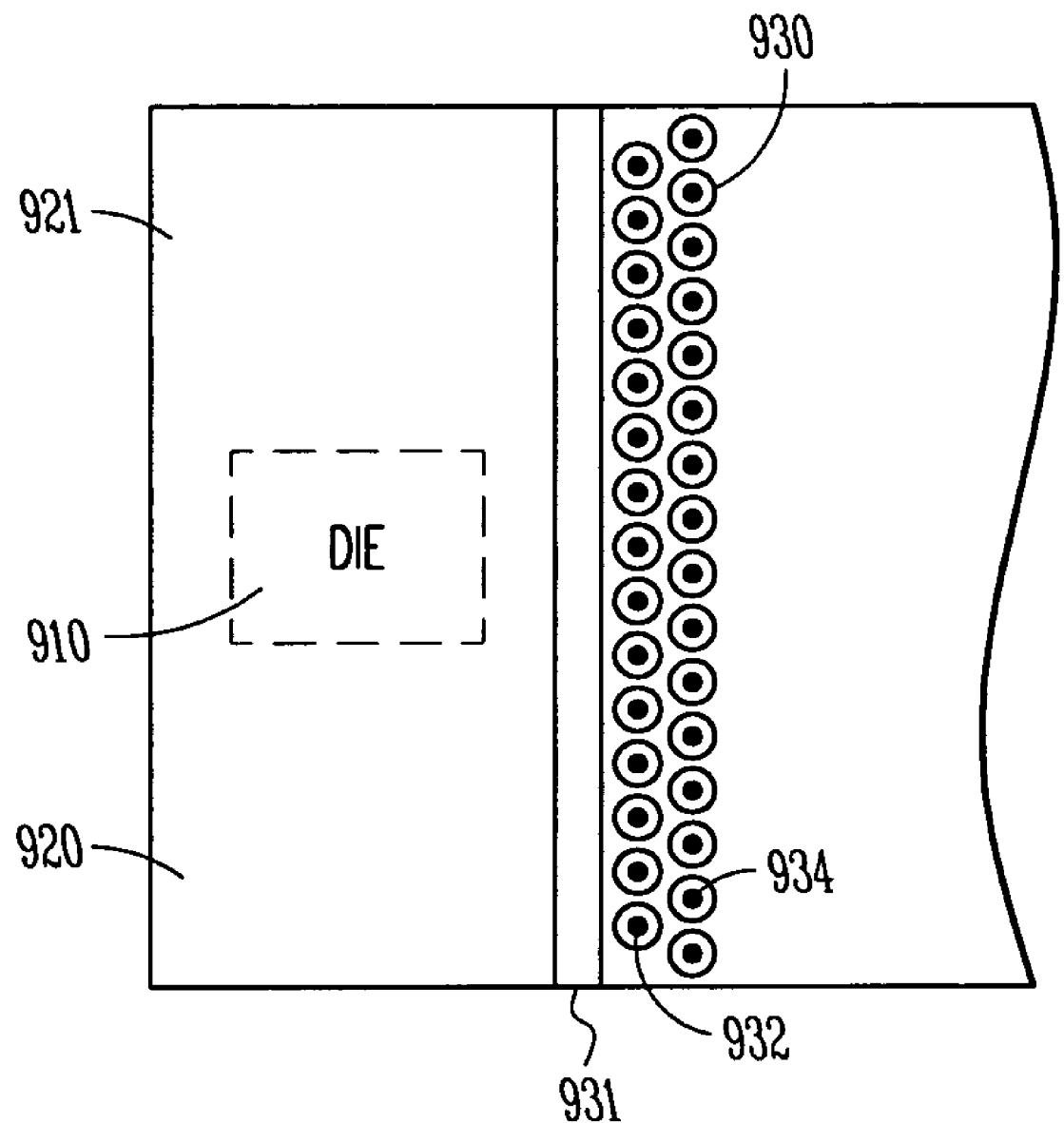
FIG. 8 is a top view of a wafer having a laser scribe area formed according to an embodiment of this invention.

FIG. 8 is a top view of a wafer 920 having a laser scribe area 930 formed according to an embodiment of this invention. The laser scribe area 930 includes a continuous laser scribe line 931 depicted by a heavy black line in FIG. 9 and carrying the reference numeral 931. The laser scribe line 931 is formed near the active device 910, which will eventually become a die or chip singulated from a wafer. The continuous line 931 provides for a smooth cut. A perforated line or a set of non-overlapping laser pulses, such as laser pulse 932 and laser pulse 934, are formed adjacent or near the continuous line 931. Each of the laser pulses 932, 934 are non-overlapping pulses and are made to ablate material within an area illuminated by the laser pulse. The non-overlapping laser pulses 932, 934 also fracture the fragile dielectric in a zone around the ablated region, namely near the laser pulses 932 and 934. The non-overlapping laser pulses are formed adjacent but not touching the continuous line 931. The non-overlapping laser pulses, such as 932 and 934, are continued along the scribe area 930. The scribe area has a width that is greater than the width of a saw blade or greater than the width of a kerf from a saw. Therefore, the non-overlapping laser pulses, such as 932, 934, are formed to provide a width to the laser scribe area 930, which is greater than the saw blade or kerf of the saw. As shown in FIG. 8, there are two rows of non-overlapping laser pulses 932, 934. It should be noted that more than two rows of non-overlapping laser pulses may be required in order to provide for an appropriate width for the saw blade.

Figure 9:
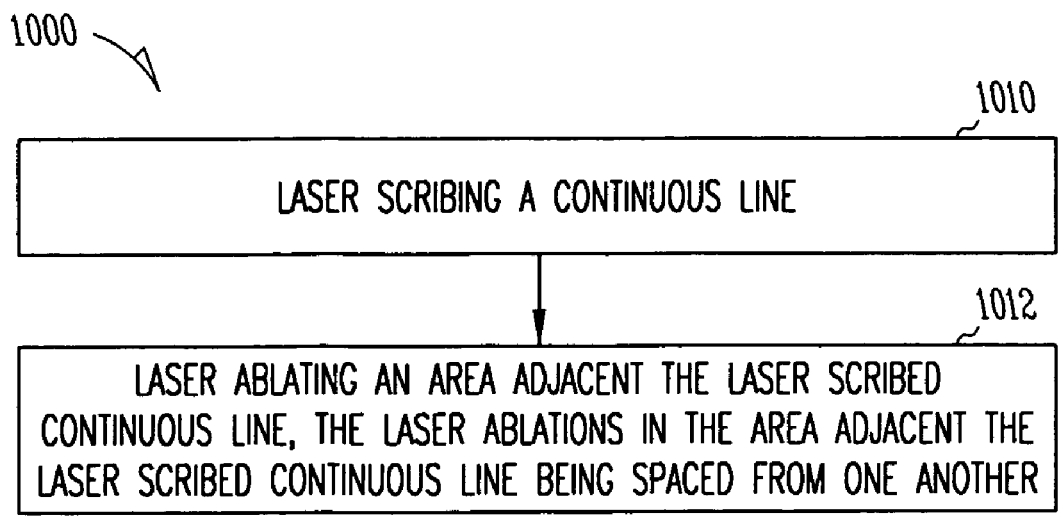
FIG. 9 is a flow diagram showing a method for forming a laser scribe area, according to an embodiment of this invention.

FIG. 9 is a flow diagram showing a method for forming a laser scribe area, according to the embodiment of this invention. The method for laser scribing a wafer 1000 includes laser scribing a continuous line 1010, and laser ablating an area adjacent the laser scribed continuous line 1012. The laser ablations in the area adjacent the laser scribed continuous line are spaced from one another 1012. The laser ablations in the area adjacent the laser scribed continuous line are non-overlapping. The laser scribed line and the laser ablated area adjacent the laser scribed continuous line have a width greater than the width of a diamond saw blade. In some embodiments, the laser scribed line and the laser ablated area adjacent the laser scribed continuous line have a width greater than the width of a kerf from a diamond saw blade. In some embodiments, laser scribing a continuous line is done next to a die 910 on a wafer 920 and wherein laser ablating an area adjacent the laser scribed continuous line is done more distant from the die of the wafer. In some embodiments, the laser ablations in the area adjacent the laser scribed continuous line are spaced from one another in a range of 1 to 100 microns. In other embodiments, the laser ablations are spaced from one another in a range of 1 to 20 microns.

Figure 10:
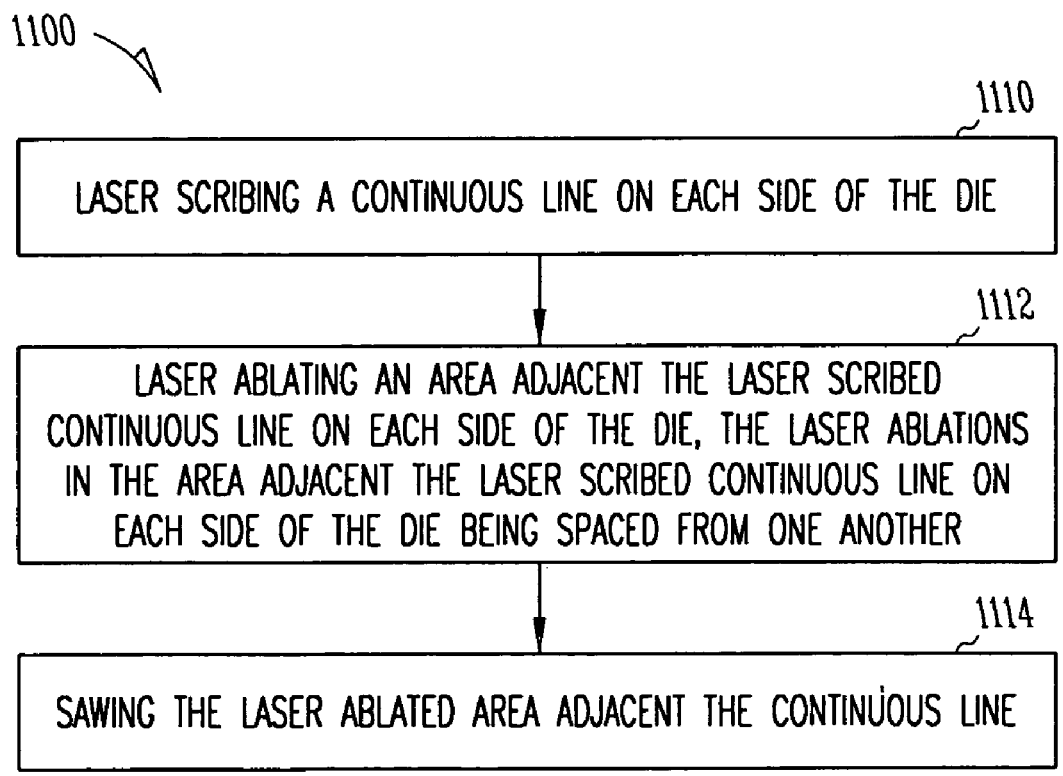
FIG. 10 is a flow diagram showing a method for singulating dies from a wafer, according to the embodiment of this invention.

FIG. 10 is a flow diagram-showing a method for singulating dies from a wafer, according to the embodiment of this invention. The method for singulating dies from a wafer 1100 includes laser scribing a continuous line on each side of the die 1112, and laser ablating an area adjacent the laser scribed continuous line on each side of the die. The laser ablations in the area adjacent the laser scribed continuous line on each side of the die being spaced from one another 1112. The method 1100 also includes sawing the laser abated area adjacent the continuous line 1114. The continuous line is proximate a die on a wafer and the laser ablating area is adjacent the laser scribed continuous line and positioned more distant from the die of the wafer than the continuous line. The laser ablations in the area adjacent the laser scribed continuous line are non-overlapping. The laser scribed line and the laser ablated area adjacent the laser scribed continuous line occupy an area having a width greater than the width of a saw blade or greater than a kerf from a saw blade. The laser ablations in the area adjacent the laser scribed continuous line are spaced from one another in a range of 2 to 10 microns.

Figure 11:
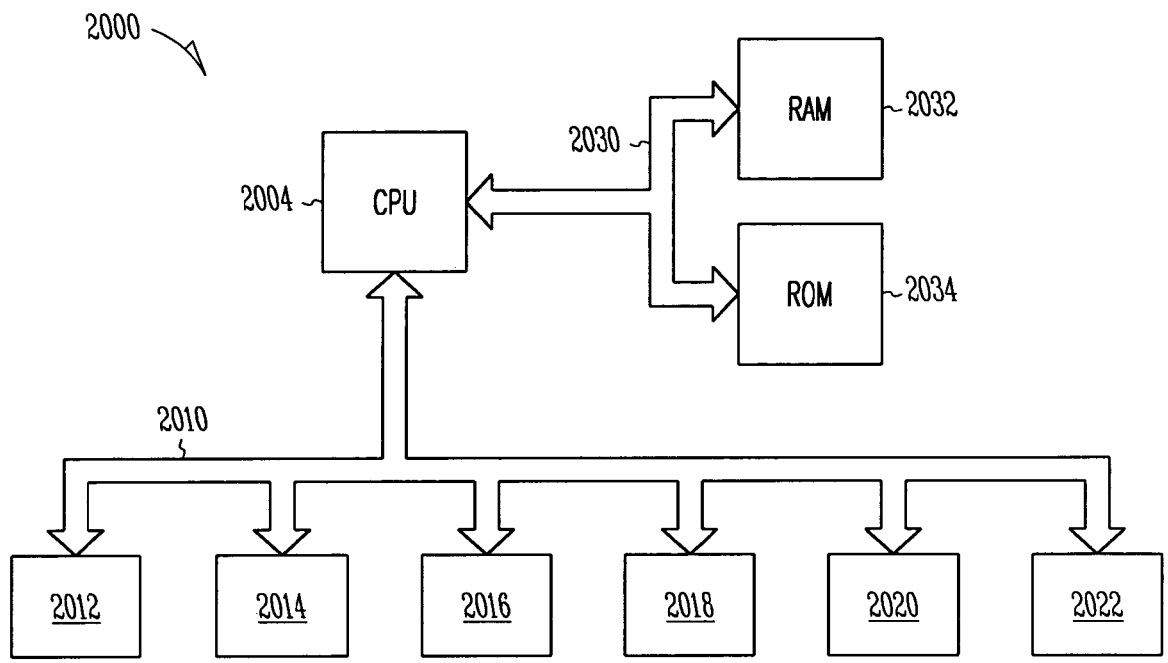
FIG. 11 is a schematic view of a computer system, according to an embodiment of this invention.

FIG. 11 is a schematic view of a computer system. Advantageously, the invention is well-suited for use in a computer system 2000. The computer system 2000 may also be called an electronic system or an information handling system and includes a central processing unit, a memory and a system bus. The information handling system includes a central processing unit 2004, a random access memory 2032, and a system bus 2030 for communicatively coupling the central processing unit 2004 and the random access memory 2032. The information handling system 2000 is included in a computer operated machine for laser scribing wafers, as described above. The information handling system 2000 may also include an input/output bus 2010 and several devices peripheral devices, such as 2012, 2014, 2016, 2018, 2020, and 2022 may be attached to the input output bus 2010. Peripheral devices may include hard disc drives, magneto optical drives, floppy disc drives, monitors, keyboards and other such peripherals. The information handling system can be a controller for controlling the positioning and timing of the laser pulses according to the methods described above and claimed below.

An apparatus includes a laser adapted to direct laser energy toward a wafer, a saw, and a microprocessor for controlling the direction of the laser energy and controlling the movement of the saw. The apparatus also includes a memory operatively coupled to the microprocessor. The memory includes an instruction set to cause a suitably programmed microprocessor to laser scribe a first continuous line on a wafer, and laser scribe an area near the first continuous line but not contacting the first continuous line. In one embodiment, the laser scribe of the area near the first area includes laser scribing a second line near the first line and further includes laser scribing a third line overlapping the first continuous line and the second line. In another embodiment, the laser scribe of the area near the first area includes producing a plurality of spaced laser ablations in the area adjacent the first continuous line.

Figure 12:
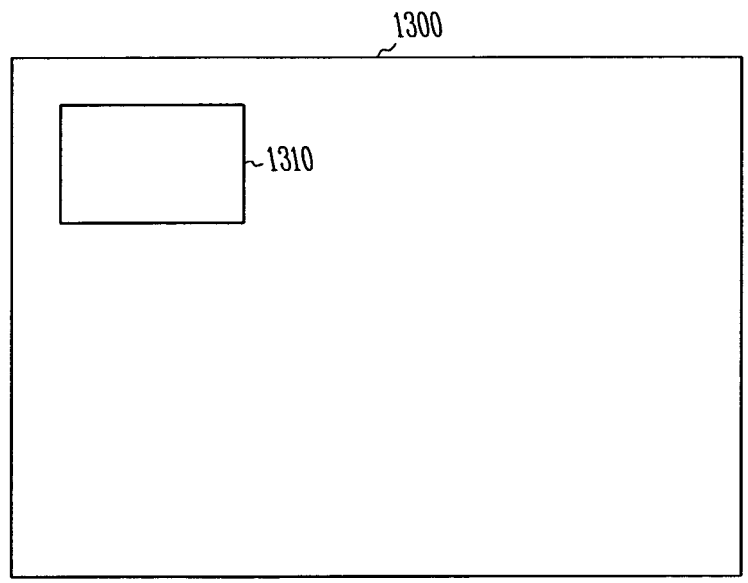
FIG. 12 is a schematic view of a computer readable medium, according to an embodiment of this invention.

FIG. 12 is a schematic of a computer readable medium 1300 that includes an instruction set 1310, according to an embodiment of this invention. The computer readable medium 1300 is capable of holding sets of instructions 1310. The computer readable medium 1310 contains instructions for causing a suitably programmed computer to execute any one or all of the methods discussed above.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for singulating dies from a wafer comprising:
   laser scribing a first continuous line;
   laser scribing a second continuous line spaced apart from the first continuous line;
   laser scribing a third continuous line, the third continuous line positioned between the first continuous line and the second continuous line; and
   passing a saw through the area of the first continuous line, the second continuous line and the third continuous line to cut the wafer.

2. The method for singulating dies from a wafer of claim 1 wherein the first continuous line, the second continuous line and the third continuous line overlap.

3. The method for singulating dies from a wafer of claim 1 wherein the third continuous line overlaps the second continuous line and the third continuous line.

4. The method for singulating dies from a wafer of claim 1 wherein the first continuous line, the second continuous line and the third continuous line are formed from overlapping pulses from a laser.

5. The method for singulating dies from a wafer of claim 1 wherein the first continuous line, the second continuous line and the third continuous line overlap are in an area having a width greater than the width of a kerf from a saw blade of the saw.

* * * * *

UNITED STATES PATENT AND TRADEMARK OFFICE
CERTIFICATE OF CORRECTION

| | | |
|---|---|---|
| PATENT NO. | : 7,772,090 B2 | Page 1 of 1 |
| APPLICATION NO. | : 10/674960 | |
| DATED | : August 10, 2010 | |
| INVENTOR(S) | : Starkston et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1588 days.

Signed and Sealed this
Thirty-first Day of May, 2011

David J. Kappos
*Director of the United States Patent and Trademark Office*

UNITED STATES PATENT AND TRADEMARK OFFICE
CERTIFICATE OF CORRECTION

PATENT NO.        : 7,772,090 B2                                          Page 1 of 1
APPLICATION NO.   : 10/674960
DATED             : August 10, 2010
INVENTOR(S)       : Starkston et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1616 days.

Signed and Sealed this
Twenty-fifth Day of October, 2011

David J. Kappos
*Director of the United States Patent and Trademark Office*